(12) United States Patent
Katoch et al.

(10) Patent No.: US 9,013,940 B2
(45) Date of Patent: Apr. 21, 2015

(54) SENSE AMPLIFIER

(71) Applicant: Taiwan Semiconductor Manufacturing Company, Ltd., Hsinchu (TW)

(72) Inventors: Atul Katoch, Kanata (CA); Mayank Tayal, Ottawa (CA); Cormac Michael O'Connell, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 8 days.

(21) Appl. No.: 13/780,772

(22) Filed: Feb. 28, 2013

(65) Prior Publication Data

US 2014/0241087 A1    Aug. 28, 2014

(51) Int. Cl.
*G11C 7/00* (2006.01)
*G11C 7/02* (2006.01)
*G11C 11/419* (2006.01)

(52) U.S. Cl.
CPC .................... *G11C 11/419* (2013.01)

(58) Field of Classification Search
USPC .................. 365/205, 207, 208, 203
See application file for complete search history.

(56) References Cited

U.S. PATENT DOCUMENTS

| | | | | |
|---|---|---|---|---|
| 5,267,197 A * | 11/1993 | McClure | ........................ | 365/207 |
| 6,331,959 B1 * | 12/2001 | Hirota | ........................ | 365/207 |
| 6,452,851 B1 * | 9/2002 | Endo et al. | ........................ | 365/207 |
| 7,894,279 B2 * | 2/2011 | Masuda et al. | ........................ | 365/207 |
| 7,983,080 B2 * | 7/2011 | Adams et al. | ........................ | 365/207 |
| 8,305,815 B2 * | 11/2012 | La Rosa | ........................ | 365/207 |
| 8,472,273 B2 * | 6/2013 | Takayama et al. | ........................ | 365/207 |
| 8,687,448 B2 * | 4/2014 | Kawasumi | ........................ | 365/207 |

* cited by examiner

*Primary Examiner* — Trong Phan
(74) *Attorney, Agent, or Firm* — Lowe Hauptman & Ham, LLP

(57) ABSTRACT

A sense amplifier comprises a cross coupled pair of inverters, a first transistor, a second transistor, and a capacitive device. The cross coupled pair of inverters includes a first end, a second end, and a third end. The first end is configured to receive a first supply voltage. The second end is coupled with a first terminal of the capacitive device and a first terminal of the first transistor. The third end is coupled with a second terminal of the capacitive device and a first terminal of the second transistor. A second terminal of the first transistor and a second terminal of the second transistor are coupled together and are configured to receive a first control signal. A third terminal of the first transistor and a third terminal of the second transistor are coupled together and are configured to receive a second supply voltage different from the first supply voltage.

19 Claims, 5 Drawing Sheets

SENSE AMPLIFIER

FIELD

The present disclosure is related to a sense amplifier.

BACKGROUND

During a read operation of a memory cell, such as a static random access memory cell (SRAM), a word line is activated to turn on the memory cell. The data stored in the memory cell then causes a voltage difference on a pair of bit lines to develop. The voltage difference is called a bit line split. Effectively, the bit line split reflects the data stored in the memory cell to be read. After the bit line split is sufficiently large, a sense amplifier is turned on to amplify and sense the bit line split. In some approaches, the sense amplifier is turned on when the bit line split is greater than an offset of the amplifier plus some margins based on a statistical sigma value of a plurality of the amplifier offset values. The wait time before the sense amplifier is turned on is usually about 60% to 70% of an overall access time to read the memory cell. The offset in the amplifier also causes a longer wait time.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
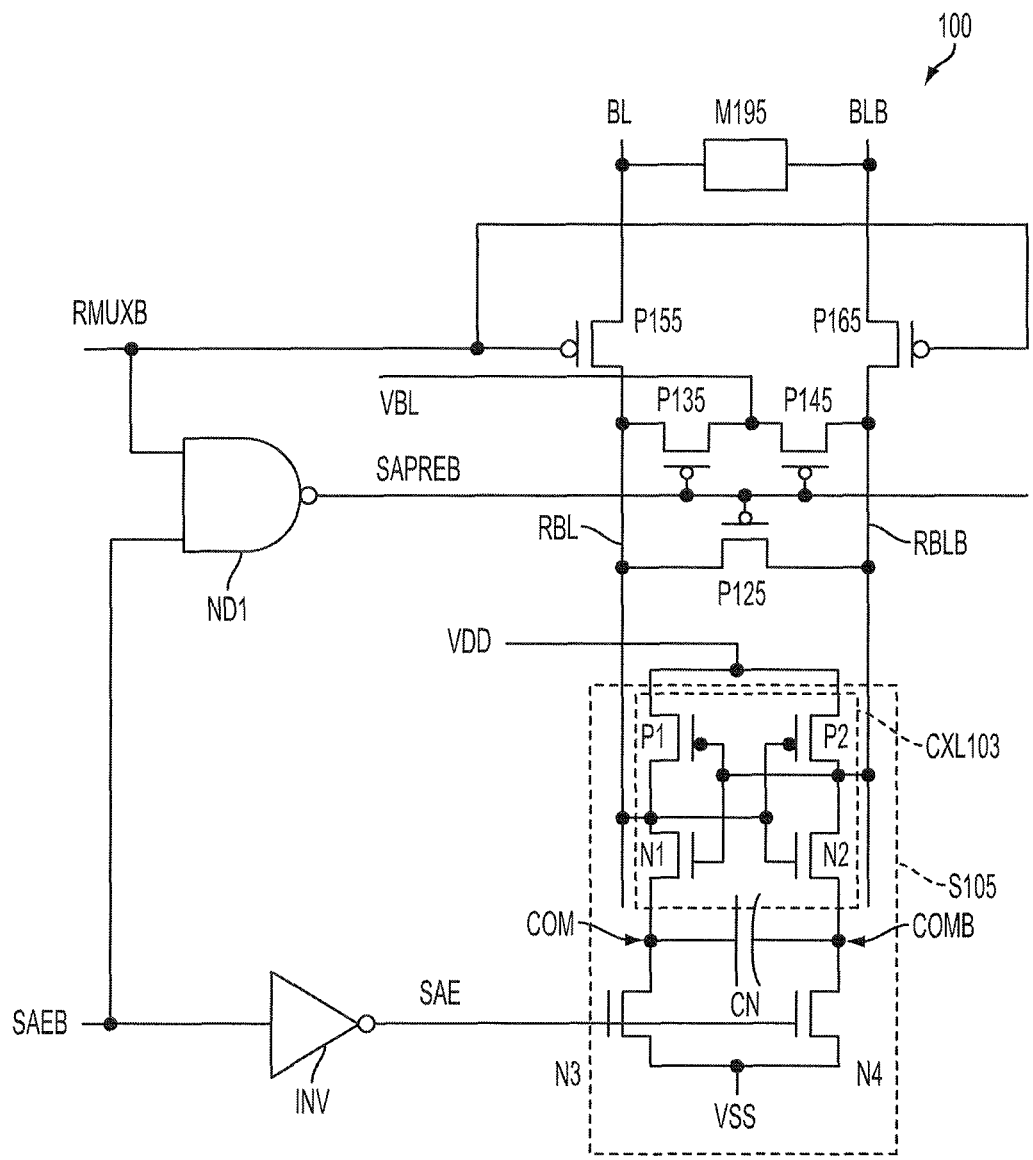
FIG. 1 is a diagram of a memory circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. An amplifier includes a compensation circuit to compensate for the offset of the amplifier. For example, in some embodiments, a control sequence is applied to the compensation circuit to reduce or eliminate the effect of the offset of the amplifier. As a result, the offset is reduced by over 50%. The sense amplifier therefore senses a bit line split smaller than the bit line split of various other approaches. Consequently, in some embodiments, a read access speed is increased by about 20%.

Memory Circuit

Figure 3:
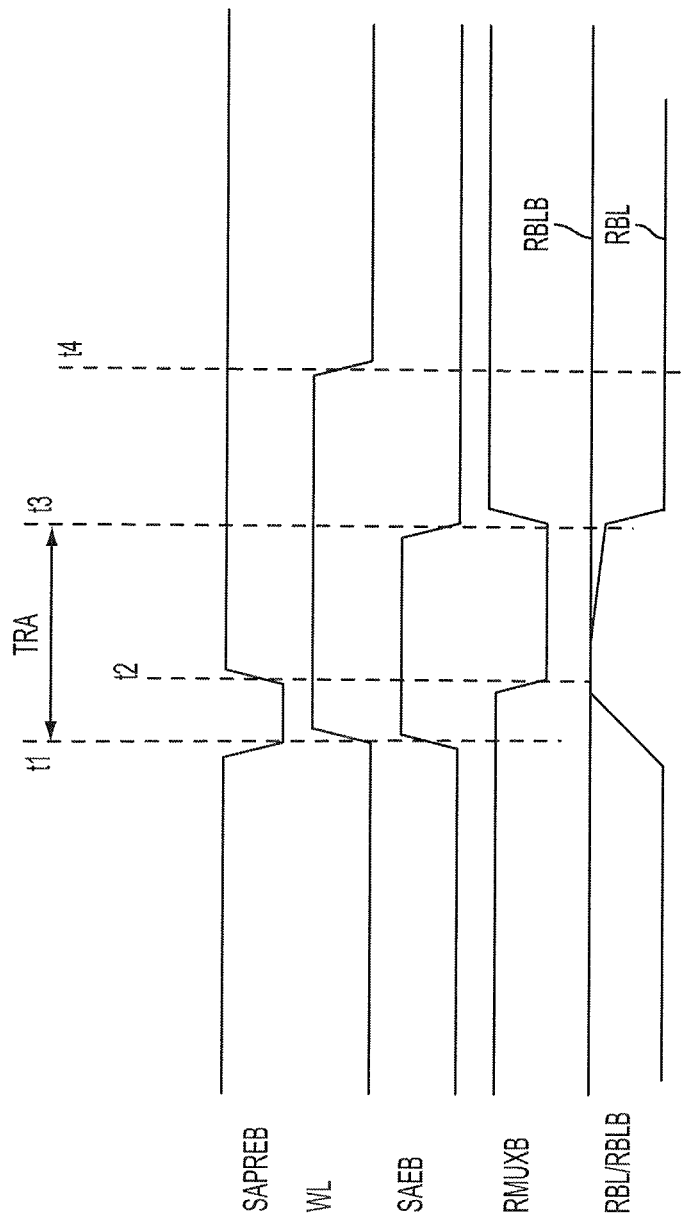
FIG. 3 is a graph of waveforms of various signals of the memory circuit of FIG. 1, in accordance with some embodiments.

FIG. 1 is a diagram of a memory circuit 100, in accordance with some embodiments. Memory circuit 100 is a static random access memory (SRAM) circuit. Other types of memory are within the scope of various embodiments. FIG. 3 is a graph of waveforms used to illustrate a read operation of memory circuit 100 in FIG. 1, in accordance with some embodiments. Detailed operation of circuit 100 is explained with reference with FIG. 3.

A signal RMUXB and PMOS transistors P155 and P165 are used to switch between a read operation and a write operation of memory circuit 100, for example. Gates of transistors P155 and 165 are coupled together and receive signal RMUXB. Drains of transistors P155 and P165 are coupled with bit lines BL and BLB, respectively. Sources of transistors P155 and P165 are coupled with bit lines RBL and RBLB, respectively.

In a read operation, signal RMUXB is logically low to turn on PMOS transistors P155 and P165. As a result, bit lines BL and BLB are electrically coupled with corresponding bit lines RBL and RBLB. Sense amplifier S105 is then turned on to sense the data stored in a memory cell M195 that has been reflected on bit lines BL and BLB and corresponding bit lines RBL and RBLB. In contrast, in a write operation, when signal RMUXB is logically high, transistors P155 and P165 are turned off and function as an open circuit. As a result, bit lines BL and BLB are electrically disconnected from bit lines RBL and RBLB and from sense amplifier S105. Data placed on bit lines BL and BLB are then written to memory cell M195.

PMOS transistors P155 and P165 being used to switch between a write and a read operation are for illustration. Other switching circuits, switching devices, NMOS transistors, etc., used to switch between a write and a read operation are within the contemplated scope of the disclosure.

A signal SAPREB and PMOS transistors P125, P135, and P145 are used to pre-charge and equalize bit lines RBL and RBLB. Signal SAPREB is at gates of transistors P125, P135, and P145. Sources of transistors P125 and P145 are coupled with bit lines RBL and RBLB, respectively. Drains of transistors P135 and P145 are coupled together and are configured to receive a voltage VBL. A drain and a source of transistor P125 is coupled with bit lines RBL and RBLB, respectively. When signal SAPREB is applied with a low logical value, transistors P125, P135, and P145 are turned on. As a result, bit lines RBL and RBLB are at a same voltage level of voltage VBL. In some embodiments, voltage VBL is at a supply voltage VDD value. Stated differently, bit lines RBL and RBLB are pre-charged and equalized to a value of supply voltage VDD. Other values of voltage VBL are within the scope of various embodiments. In some embodiments, when bit lines RBL and RBLB are pre-charged to supply voltage VDD, nodes COM and COMB are also pulled towards supply voltage VDD of read bit lines RBL and RBLB, respectively. For example, node COM is pulled to VDD−VthN1 where VthN1 is a threshold voltage of transistor N1. Similarly, node COMB is pulled to VDD−VthN2 where VthN2 is a threshold voltage of transistor N2. As a result, an offset of sense amplifier S5105 caused by transistors N1 and N2 is compensated as further explained in detail below.

PMOS transistors P125, P135, and P145 being used to pre-charge and equalize bit lines RBL and RBLB are for illustration. Other circuits and/or other types of transistors, such as NMOS transistors, used to pre-charge and equalize bit lines RBL and RBLB are within the contemplated scope of the disclosure.

Bit lines BL and BLB serve as both data input and output for a memory cell M195. In some embodiments, in a write operation, applying a logical value to a first bit line and the opposite logical value to the other bit line enables writing the logical values at the bit lines to memory cell M195.

A voltage difference between bit line BL and bit line BLB is called a bit line split. In a read operation, sensing a bit line split of bit lines BL and BLB reveals the data stored in memory cell M195. In some embodiments, in a read operation, bit lines BL and BLB are electrically coupled with corresponding bit lines RBL and RBLB. As a result, sensing a bit line split of bit lines RBL and RBLB is the same as sensing a bit line split of bit lines BL and BLB. In other words, sensing a bit line split of bit lines RBL and RBLB also reveals the data stored in memory cell M195.

Sense amplifier S105 is used to sense or read the data stored in memory cell M195 based on a bit line split of bit lines RBL and RBLB. When a bit line split of bit lines RBL and RBLB is sufficiently developed, sense amplifier S105 is turned on to sense the bit line split of bit lines RBL and RBLB that, through bit lines BL and BLB, represents the data read from memory cell M195.

Transistors P1, P2, N1, and N2 form a cross latch or a cross coupled pair of inverters CXL103 of sense amplifier S105. Transistors P1 and N1 form a first inverter. Transistors P2 and N2 form a second inverter. Drains of transistors P1 and N1 are coupled together and are coupled with bit line RBL. Drains of transistors P2 and N2 are coupled together and are coupled with bit line RBLB. Gates of transistors P1 and N1 are coupled together and with drains of transistors P2 and N2. Gates of transistors P2 and N2 are coupled together and with drains of transistors P1 and N1. Effectively, cross-coupled pair of inverters CXL103 includes a first terminal receiving supply voltage VDD, a second terminal coupled with node COM, and a third terminal coupled with node COMB.

A signal SAE and a pair of NMOS transistors N3 and N4 are used to turn on and off sense amplifier S105. For example, when signal SAE at a gate of each NMOS transistors N3 and N4 is logically low, NMOS transistors N3 and N4 are turned off and functions as an open circuit. In such a condition, in some embodiments, node COM is charged through NMOS transistor N1 towards a high logical value of bit line RBL. For example, if bit line RBL is at supply voltage VDD, node COM is at VDD−VthN1 wherein VthN1 is a threshold voltage of transistor N1. Similarly, node COMB is charged through NMOS transistor N2 towards a high logical value of bit line RBLB. For another example, if bit line RBLB is also at supply voltage VDD, node COMB is at VDD−VthN2 wherein VthN2 is a threshold voltage of transistor N2. Detailed operations of sense amplifier S105 is explained with reference with FIG. 3.

In contrast, when signal SAE is logically high, sense amplifier S105 is in a sensing operation. For example, when signal SAE is logically high, NMOS transistors N3 and N4 are turned on, and serve as a current path for sense amplifier S105. Because NMOS transistors N3 and N4 are turned on, both nodes COM and COMB are pulled to reference voltage VSS at sources of NMOS transistors N3 and N4. In some embodiments, when transistor N3 is turned on, bit line RBL has the same logical value as that when bit line RBL was sensed in a previous read operation. Similarly, when transistor N4 is turned on, bit line RBLB has the same logical value as that when bit line RBLB was sensed in a previous read operation.

Capacitor CN is to capacitively decouple nodes COM and COMB. In some embodiments, a capacitance value of capacitor CN is selected based on simulation for such decoupling purposes. Capacitor CN, transistor N3, and transistor N4 are also called a compensation circuit for sense amplifier S105 because capacitor CN, transistors N3 and N4 operate with transistors N1 and N2 for nodes COM and COMB to be pulled to VDD−VthN1 and VDD−VthN2 as explained above.

An inverter INV is used to generate signal SAE based on a signal SAEB. Effectively, signal SAE and signal SAEB are an inverse logic of one another.

A NAND gate ND1 is used to generate signal SAPREB based on signal RMUXB and signal SAEB. Based on an operation of NAND gate ND1, when signal SAEB is logically high, signals RMUXB and SAPREB are an inverse logic of one another. Similarly, when signal RMUXB is logically high, signals SAEB and SAPREB are an inverse logic of one another. In such a condition, signals SAE and signal SAPREB have the same logical value.

Memory Cell

Figure 2:
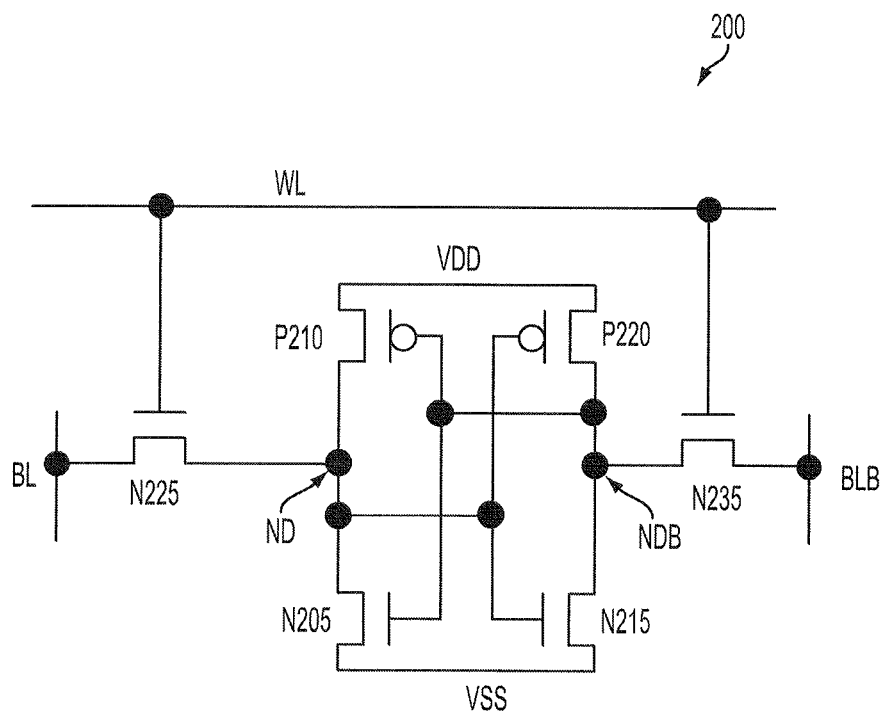
FIG. 2 is a diagram of a memory cell of the memory circuit in FIG. 1, in accordance with some embodiments.

FIG. 2 is a diagram of a memory cell or memory circuit 200, in accordance with some embodiments. Memory circuit 200 is an embodiment of memory cell M195 in FIG. 1.

Memory cell 200 includes two P-type metal oxide semiconductor (PMOS) transistors P210 and P220, and four N-type metal oxide semiconductor (NMOS) transistors N205, N215, N225, and N235. Transistors P210, P220, N205, and N215 form a cross latch. Drains of transistors P210 and N205 are coupled together and form a node ND. Drains of transistors P220 and N215 are coupled together and form a node NDB. Gates of transistors P210 and N205 are coupled together and with drains of transistors P220 and N215. Gates of transistors P220 and N215 are coupled together and with drains of transistors P210 and N205.

A word line WL is coupled with a gate of each of transistors N225 and N235. In a row of memory cells 200, word line WL is coupled with a gate of each of transistors N225 and N235 of a plurality of memory cells in the row of memory cells. Word line WL is also called a control line because the signal on word line WL turns and off transistors N225 and N235 for data on bit lines BL and BLB to be transferred from and to corresponding nodes ND and NDB.

Drains of each of transistors N225 and N235 are coupled to bit lines BL and BLB, respectively. In a column of memory cells 200, bit lines BL and BLB are coupled with each drain of transistors N225 and N235 of a plurality of memory cells 200 in the column of memory cells 200. Each of bit lines BL and BLB is also called a data line because data carried on bit lines BL and BLB are written to and read from corresponding nodes ND and NDB.

In a write operation of memory cell 200, in some embodiments, bit lines BL and BLB are pre-charged to a high logical value and are then left floating with the pre-charged high logical value. Word line WL is then activated to turn on transistors N225 and N235, which transfer the data on bit lines BL and BLB to corresponding nodes ND and NDB.

In a read operation, transistors P155 and P165 in FIG. 1 are turned on to electrically couple bit lines BL and BLB with bit lines RBL and RBLB, respectively. As a result, a reference to bit lines BL and BLB in a read operation also refers to corresponding bit lines RBL and RBLB. In other words, in a read operation, bit lines BL and BLB are electrically the same as corresponding bit lines RBL and RBLB.

Further, in a read operation, bit lines BL and BLB are pre-charged to a high logical value. Word line WL is then activated to turn on transistors N225 and N235. The data in nodes ND and NDB are therefore transferred to bit lines BL and BLB. Based on a low logical value of the data stored in a corresponding node ND or node NBD, one bit line is pulled towards a low logical value and the other bit line remains at the same pre-charged high logical value. In other words, a bit line split between bit lines BL and BLB develops. When the bit line split is sufficiently large, sense amplifier S105 in FIG. 1 is turned on to sense the bit line split between bit lines BL and BLB and reveals the data stored in nodes ND and NDB.

For illustration, node ND stores a low logical value, and node NDB stores a high logical value. Because bit line BLB is logically high, node NDB via the then turned-on transistor N235 remains at the high logical value. Because node NDB is at a gate of NMOS transistor N205 and has a high logical value, NMOS transistor N205 is turned on. Because both transistors N225 and N205 are turned on, bit line BL is pulled towards reference voltage VSS or ground at the source of NMOS transistor N205. As bit line BLB stays at the same high logical value and bit line BL is pulled towards a low logical value, a bit line split between bit lines BL and BLB develops. When the bit line split is sufficiently large, sense amplifier S105 is turned on to sense the bit line split and recognizes bit line BL being pulled towards a low logical value. In other words, sense amplifier S105 recognizes that node ND stores a low logical value and node NDB therefore stores a high logical value.

When node ND stores a high logical value, node NDB stores a low logical value. Sensing node ND storing a high logical value is similar to sensing node NDB storing a low logical value. Operations to sense node NDB having a low logical value with reference to NMOS transistors N235, N215 and bit line BLB are similar to operations to sense node ND having a low logical value with reference to NMOS transistors N225, N205 and bit line BL as explained above.

Waveforms

FIG. 3 is a graph of waveforms used to illustrate a read operation of memory circuit 100 in FIG. 1, in accordance with some embodiments. Because signal SAE and signal SAEB are an inverse logic of one another, for simplicity, a waveform of signal SAE is not shown, and is referenced to an inversed waveform of signal SAEB.

At a time t1, word line WL is activated with a high logical value. As a result, NMOS transistors N225 and N235 in FIG. 2 are activated, and the data on bit lines BL and BLB are electrically connected with nodes ND and NDB, respectively. For illustration, node ND stores a low logical value while node NDB stores a high logical value. As a result, transistor N215 is turned off, and transistor N205 is turned on.

Also at about time t1, signal SAEB is driven with a high logical value. Signal SAE is therefore logically low. Because signal RMUXB is logically high, by operation of NAND gate ND1, signal SAPREB is an inverse of signal SAEB. Effectively, signal SAPREB has a same logical value as that of signal SAE.

As illustratively shown, at about time t1, signal SAPREB turns to a low logical value in response to signal SAEB and signal SAE turning to a high and a low logical value, respectively. Because signal SAPREB is logically low, PMOS transistors P125, P135, and P145 are turned on to pre-charge and equalize bit lines RBL and RBLB to supply voltage VDD.

Because signal SAE is logically low, NMOS transistors N3 and N4 in FIG. 1 are turned off. Nodes COM and COMB are electrically disconnected from reference voltage VSS at the source of transistors N3 and N4. By operation of transistors N1 and N2, nodes COM and COMB are pulled towards supply voltage VDD at the drains of transistors N1 and N2, respectively. Node COM is thus at VDD−VthN1, while node COMB is at VDD−VthN2.

At a time t2, signal RMUXB is driven to a low logical value. As a result, signal SAPREB is logically high. Transistors P125, P135, and P145 are therefore turned off to stop charging bit lines RBL and RBLB.

Because signal RMUXB is logically low, PMOS transistors P155 and P156 are turned on. As a result, bit lines RBL and RBLB are electrically connected with bit lines BL and BLB, respectively. Because bit line RBL is floating, bit line BL is also floating.

For illustration, node ND stores a low logical value while node NDB stores a high logical value. Because bit line BL is logically high and is floating, and NMOS transistor N205 in FIG. 2 is turned on, transistor N205, through node ND, pulls bit line BL towards reference voltage VSS at the source of transistor N205. Further, because transistor N215 is turned off, node NDB is logically high and bit line BLB is logically high, bit line BLB stays at the same pre-charged high logical value. Because bit line BLB stays at a high logical value, and bit line BL is pulled towards reference voltage VSS, a voltage difference between bit line BL and bit line BLB develops. In other words, a bit line split of bit line BL and bit line BLB develops.

At about time t3, when the bit line split is sufficiently large, signal SAEB is driven with a low logical value. Signal SAE is therefore logically high. As a result, transistors N3 and N4 in FIG. 1 are turned on. In other words, sense amplifier S105 is turned on to sense the bit line split.

At a time t4, word line WL is pulled to a low logical value to complete a read operation.

In some embodiments, a read access time TRA of sense amplifier S105 is defined as a time when word line WL is activated to a time when sense amplifier S105 is able to sense the bit line split of bit lines RBL and RBLB. In the illustration of FIG. 3, read access time TRA is defined as a time between time t1 and time t3. Time t1 is when word line WL is activated with a high logical value, and time t3 is when signal SAE is logically high for sense amplifier S105 to turn on and sense the bit line split of bit lines RBL and RBLB.

In the above illustration of a read operation of circuit 100, when node COM is pulled to voltage VDD−VthN1 and node COMB is pulled to voltage VDD−VthN2, if there is any mismatch between transistor N1 and transistor N2, there is a difference in voltage VthN1 and voltage VthN2. There is also a difference between voltage VDD−VthN1 at node COM and voltage VDD−VthN2 at node COMB. Any mismatch between transistor N1 and N2, however, is compensated by the voltage difference between voltage VDD−Vthn1 at node COM and voltage VDD−VthN2 at node COMB. In other words, the offset caused by the mismatch between transistors N1 and N2 or the offset experienced by sense amplifier S105 is compensated. As a result, read access time TRA of sense amplifier S105 is smaller compared with a read access time of another approach. For example, read access time TRA of sense amplifier S105 is about 300 picoseconds (ps), while the read access time of another amplifier in another approach is about 500 ps.

Memory Circuit, Further Embodiments

Figure 4:
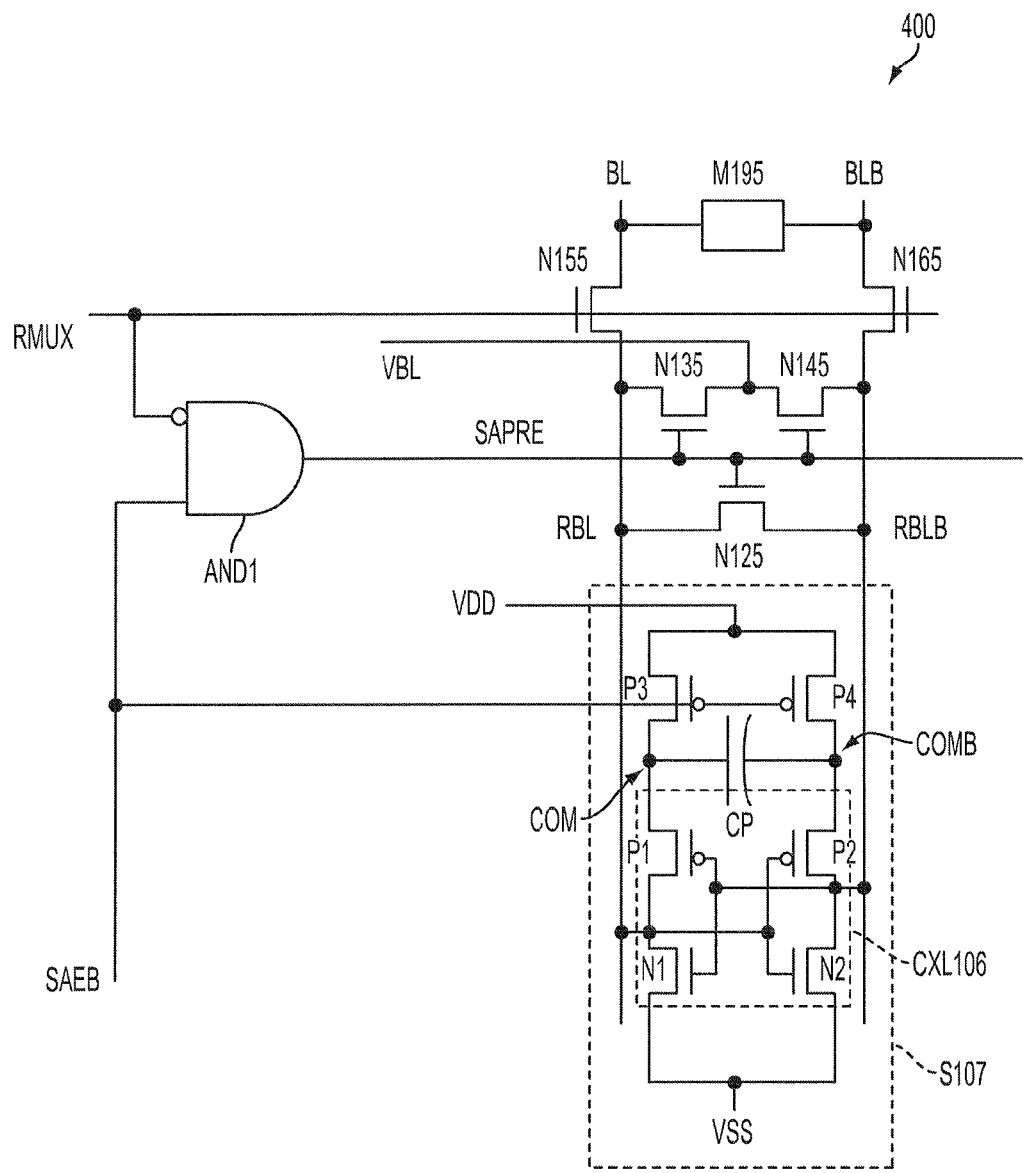
FIG. 4 is a diagram of a memory circuit, in accordance with some embodiments.
Figure 5:
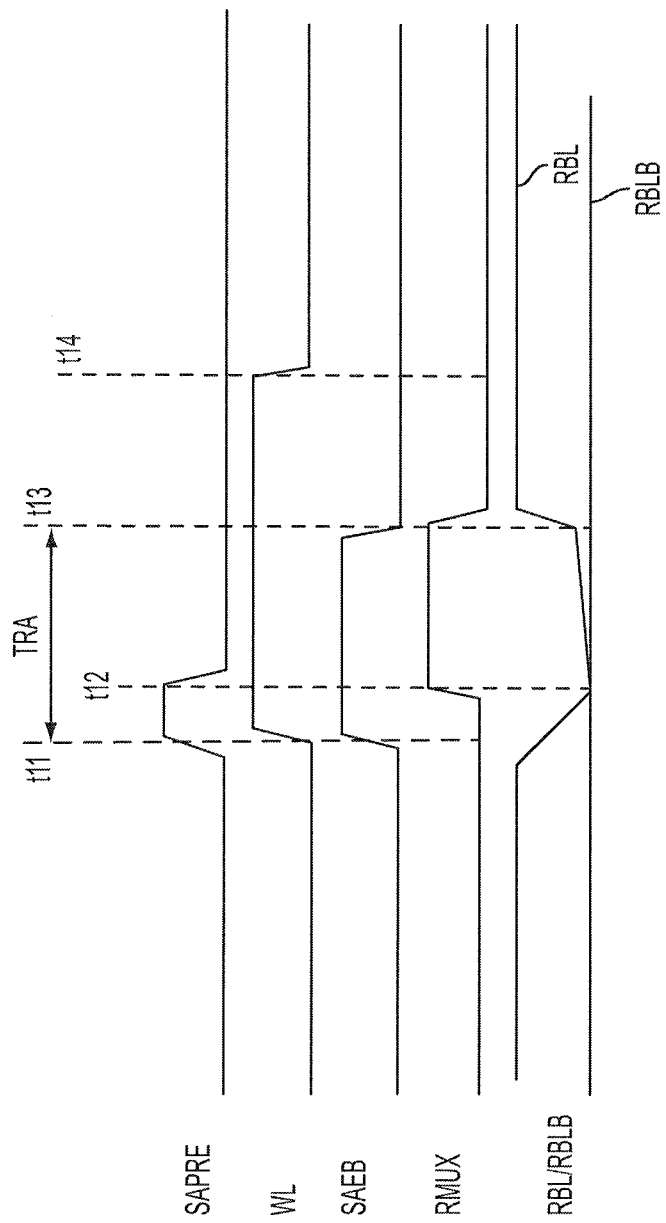
FIG. 5 is a graph of waveforms of various signals of the memory circuit in FIG. 4, in accordance with some embodiments.

FIG. 4 is a diagram of a memory circuit 400, in accordance with some embodiments. Memory circuit 400 is another embodiment of memory circuit 100. Memory circuit 400 is also called VSS sensing while memory circuit 100 is called VDD sensing. FIG. 5 is a graph of waveforms used to illustrate a read operation of memory circuit 400 in FIG. 4, in accordance with some embodiments. Detailed operation of circuit 400 is explained with reference with FIG. 5.

Compared with circuit 100, a sense amplifier S107 replaces sense amplifier S105. A PMOS transistor P3, a PMOS transistor P4 and a capacitor CP replace NMOS transistor N3, NMOS transistor N4 and capacitor CN, respectively. As a result, connections and configurations of sense amplifier S107, PMOS transistor P3, PMOS transistor P4 and capacitor CP and related circuits are changed accordingly.

For example, a signal RMUX and NMOS transistors N155 and N165 are used to switch between a read operation and a write operation of memory circuit 400. Gates of transistors N155 and 165 are coupled together and receive signal RMUX. Drains of transistors N155 and N165 are coupled with bit lines BL and BLB, respectively. Sources of transistors N155 and N165 are coupled with bit lines RBL and RBLB, respectively.

In a read operation, signal RMUX is logically high to turn on NMOS transistors N155 and N165. As a result, bit lines BL and BLB are electrically coupled with corresponding bit lines RBL and RBLB. Sense amplifier S107 is turned on to sense the data stored in a memory cell M195 that has been reflected on bit lines BL and BLB and corresponding bit lines RBL and RBLB. In contrast, in a write operation, for example, when signal RMUX is logically low, transistors N155 and N165 are turned off and function as an open circuit. As a result, bit lines BL and BLB are electrically disconnected from bit lines RBL and RBLB and from sense amplifier S107.

A signal SAPRE and NMOS transistors N125, N135, and N145 are used to pre-charge and equalize bit lines RBL and RBLB. Signal SAPRE is at gates of transistors N125, N135, and N145. Sources of transistors N125 and N145 are coupled with bit lines RBL and RBLB, respectively. Drains of transistors N135 and N145 are coupled together and are configured to receive a voltage VBL. A drain and a source of transistor N125 is coupled with bit lines RBL and RBLB, respectively. When signal SAPRE is applied with a high logical value, transistors N125, N135, and N145 are turned on. As a result, bit lines RBL and RBLB are at a same voltage level of voltage VBL. In some embodiments, voltage VBL is at a reference supply voltage value VSS. Stated differently, bit lines RBL and RBLB are pre-charged and equalized to a value of reference supply voltage VSS. Other values of voltage VBL are within the scope of various embodiments. In some embodiments, when bit lines RBL and RBLB are pre-charged to supply reference voltage VSS, nodes COM and COMB are also pulled towards supply voltage VSS of read bit lines RBL and RBLB, respectively.

Signal SAEB and PMOS transistors P3 and P4 are used to turn on and off sense amplifier S107. For example, when signal SAEB at a gate of each PMOS transistors P3 and P4 is logically high, PMOS transistors P3 and P4 are turned off and functions as an open circuit. In such a condition, in some embodiments, node COM is charged through PMOS transistor P1 to a low logical value of bit line RBL. For example, if bit line RBL is at reference supply voltage VSS, node COM is at VSS−VthP1 wherein VthP1 is a threshold voltage of transistor P1. Similarly, node COMB is charged through PMOS transistor P2 towards a low logical value of bit line RBLB. For another example, if bit line RBLB is also at supply reference voltage VSS, node COMB is at VSS−VthP2 wherein VthP2 is a threshold voltage of transistor P2. In some embodiments, when signal SAEB is logically low, sense amplifier S107 is in a sensing operation.

When signal SAEB is logically low, PMOS transistors P3 and P4 are turned on, and serve as a current path for sense amplifier S107. Because PMOS transistors P3 and P4 are turned on, both nodes COM and COMB are pulled to supply voltage VDD at sources of PMOS transistors P3 and P4.

Transistors P1, P2, N1, and N2 form a cross latch or a cross coupled pair of inverters CXL106 of sense amplifier S107. Cross-coupled pair of inverters CXL106 includes a first terminal receiving supply reference voltage VSS, a second terminal coupled with node COM, and a third terminal coupled with node COMB.

Capacitor CP is to capacitively decouple nodes COM and COMB. In some embodiments, a capacitance value of capacitor CP is selected based on simulation for such decoupling purposes. Capacitor CP, transistor P3, and transistors P4 are also called a compensation circuit for sense amplifier S105 because capacitor CP, transistors P3 and P4 operate with transistors P1 and P2 for nodes COM and COMB to be pulled to VDD−VthP1 and VDD−VthP2 as explained above.

An AND gate AND1 is used to generate signal SAPRE based on signal RMUX and signal SAEB. Based on an operation of AND gate AND1, when signal SAEB is logically high, an inverse of signal RMUX and signal SAPRE have a same logical value. Similarly, when signal RMUX is logically low, signals SAEB and SAPRE have a same logical value.

Waveforms

Operations of circuit 400 are similar to operations of circuit 100, considering the difference between circuit 400 and 100 as described above.

FIG. 5 is a graph of waveforms used to illustrate a read operation of memory circuit 400 in FIG. 4, in accordance with some embodiments.

At a time t11, word line WL is activated with a high logical value. As a result, NMOS transistors N225 and N235 in FIG. 2 are activated, and the data on bit lines BL and BLB are electrically connected with nodes ND and NDB, respectively. For illustration, node ND stores a high logical value while node NDB stores a low logical value. As a result, transistor P220 is turned off, and transistor P210 is turned on.

At about the same time t11, signal SAEB is driven with a high logical value. Because signal RMUX is logically low, signal SAPRE follows signal SAEB.

As illustratively shown, at time t11, signal SAPRE turns to a high logical value in response to signal SAEB turning to a high logical value. Because signal SAPRE is logically high, NMOS transistors N125, N135, and N145 are turned on to pre-charge and equalize bit lines RBL and RBLB to reference supply voltage VSS.

Because signal SAEB is logically high, PMOS transistors P3 and P4 in FIG. 4 are turned off. Nodes COM and COMB are electrically disconnected from supply voltage VDD at the source of transistors P3 and P4. By operation of transistors P1 and P2, nodes COM and COMB are pulled towards supply reference voltage VSS at the drains of transistors P1 and P2, respectively. Node COM is thus at VSS−VthP1, while node COMB is at VSS−VthP2. In other words, any offset of sense amplifier S107 is compensated.

At a time t12, signal RMUX is driven to a high logical value. As a result, signal SAPRE is logically low. Transistors N125, N135, and N145 are therefore turned off to stop charging bit lines RBL and RBLB.

Because signal RMUX is logically high, NMOS transistors N155 and N165 are turned on. As a result, bit lines RBL and RBLB are electrically connected with bit lines BL and BLB, respectively. Because bit line RBL is floating, bit line BL is also floating.

For illustration, node ND stores a high logical value while node NDB stores a low logical value. Because bit line BL is logically low and is floating, and PMOS transistor P210 in FIG. 2 is turned on, transistor P210, through node ND, pulls bit line BL towards supply voltage VDD at the source of transistor P210. Further, because transistor N215 is turned on, node NDB is logically low and bit line BLB is logically low, bit line BLB stays at the same pre-charged low logical value. Because bit line BLB stays at a low logical value, and bit line BL is pulled towards supply voltage VDD, a voltage difference between bit line BL and bit line BLB develops. In other words, a bit line split of bit line BL and bit line BLB develops.

At about time t13, when the bit line split is sufficiently large, signal SAEB is driven with a low logical value. As a result, transistors P3 and P4 in FIG. 4 are turned on. In other words, sense amplifier S107 is turned on to sense the bit line split of bit lines BL and BLB.

At a time t14, word line WL is pulled to a low logical value to complete a read operation.

In some embodiments, a sense amplifier comprises a cross coupled pair of inverters, a first transistor, a second transistor, and a capacitive device. The cross coupled pair of inverters includes a first end, a second end, and a third end. The first end is configured to receive a first supply voltage. The second end is coupled with a first terminal of the capacitive device and a first terminal of the first transistor. The third end is coupled with a second terminal of the capacitive device and a first terminal of the second transistor. A second terminal of the first transistor and a second terminal of the second transistor are coupled together and are configured to receive a first control signal. A third terminal of the first transistor and a third terminal of the second transistor are coupled together and are configured to receive a second supply voltage different from the first supply voltage.

In a method of some embodiments, a voltage value is applied to a first data line and a second data line. A first node of a sense amplifier is caused to have a first voltage value towards a voltage value at the first data line. A second node of the sense amplifier is caused to have a second voltage value towards a voltage value at the second data line. A differential voltage between the first data line and the second data line is caused to develop. The developed differential voltage between the first data line and the second data line is sensed.

In a method of some embodiments, a first node of a memory cell is electrically coupled with a first data line and a second node of the memory cell is electrically coupled with a second data line. The first data line is electrically coupled with a third data line and the second data line is electrically coupled with a fourth data line. A voltage value is applied to the third data line and the fourth data line. A first node of a sense amplifier is caused to have a first voltage value closer a voltage value at the third data line based on a threshold voltage of a first transistor of the sense amplifier. A second node of the sense amplifier is caused to have a second voltage value closer to a voltage value at the fourth data line based on a threshold voltage of a second transistor of the sense amplifier. A differential voltage is caused between the third data line and the fourth data line to develop. The developed differential voltage between the first data line and the second data line is sensed.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or a high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

Various figures showing discrete capacitors are for illustration. Equivalent circuitry may be used. For example, a capacitive device, circuitry or network (e.g., a combination of capacitors, capacitive devices, circuitry, etc.) can be used in place of the capacitor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A sense amplifier comprising:
  a cross coupled pair of inverters having a first inverter output, a second inverter output, a first end, a second end, and a third end;
  a pre-charge and equalizing circuit electrically coupled between the first inverter output and the second inverter output;
  a first data line;
  a second data line;
  a first switch between the first data line and the first inverter output;
  a second switch between the second data line and the second inverter output;
  a first transistor;
  a second transistor;
  a capacitive device;
  a NAND gate; and
  an inverter,
  wherein
    the first end is configured to receive a first supply voltage;
    the second end is coupled with a first terminal of the capacitive device and a first terminal of the first transistor;
    the third end is coupled with a second terminal of the capacitive device and a first terminal of the second transistor;
    a second terminal of the first transistor and a second terminal of the second transistor are coupled together and are configured to receive a first control signal;
    a third terminal of the first transistor and a third terminal of the second transistor are coupled together and are configured to receive a second supply voltage different from the first supply voltage;
    a first input of the NAND gate is configured to receive a second control signal;
    a second input of the NAND gate is configured to receive a third control signal usable to control the first switch and the second switch; and
    the inverter is configured to receive the second control signal and generate the first control signal usable to control the first transistor and the second transistor.

2. The sense amplifier of claim 1, wherein
  the cross coupled pair of inverters includes a first PMOS transistor, a second PMOS transistor, a first NMOS transistor, and a second NMOS transistor;
  a third NMOS transistor is configured to serve as the first transistor;
  a fourth NMOS transistor is configured to serve as the second transistor;

a source of the first PMOS transistor is coupled with a source of the second PMOS transistor, and serves as the first end;
a drain of the first PMOS transistor is coupled with the first inverter output, a drain of the first NMOS transistor, a gate of the second PMOS transistor, and a gate of the second NMOS transistor;
a drain of the second PMOS transistor is coupled with the second inverter output, a drain of the second NMOS transistor, a gate of the first PMOS transistor, and a gate of the first NMOS transistor;
a source of the first NMOS transistor is coupled with a drain of the third NMOS transistor, and serves as the second end;
a source of the second NMOS transistor is coupled with a drain of the fourth NMOS transistor, and serve as the third end;
a source of the third NMOS transistor serves as the third terminal of the first transistor; and
a source of the fourth NMOS transistor serves as the third terminal of the second transistor.

3. The sense amplifier of claim 2, wherein
the pre-charge and equalizing circuit comprises a third PMOS transistor, a fourth PMOS transistor, and a fifth PMOS transistor; and
a memory cell electrically coupled with the first data line and the second data line.

4. A sense amplifier comprising:
a cross coupled pair of inverters having a first inverter output, a second inverter output, a first end, a second end, and a third end;
a pre-charge and equalizing circuit electrically coupled between the first inverter output and the second inverter output;
a first data line;
a second data line;
a first switch between the first data line and the first inverter output;
a second switch between the second data line and the second inverter output;
a first transistor;
a second transistor;
a capacitive device; and
an AND gate,
wherein
the first end is configured to receive a first supply voltage;
the second end is coupled with a first terminal of the capacitive device and a first terminal of the first transistor;
the third end is coupled with a second terminal of the capacitive device and a first terminal of the second transistor;
a second terminal of the first transistor and a second terminal of the second transistor are coupled together and are configured to receive a first control signal;
a third terminal of the first transistor and a third terminal of the second transistor are coupled together and are configured to receive a second supply voltage different from the first supply voltage;
a first input of the AND gate is configured to receive the first control signal usable to control the first transistor and the second transistor; and
a second input of the AND gate is configured to receive a second control signal usable to control the first switch and the second switch.

5. The sense amplifier of claim 4, wherein
the cross coupled pair of inverters includes a first PMOS transistor, a second PMOS transistor, a first NMOS transistor, and a second NMOS transistor;
a third PMOS transistor is configured to serve as the first transistor;
a fourth PMOS transistor is configured to serve as the second transistor;
a source of the first NMOS transistor is coupled with a source of the second NMOS transistor, and serves as the first end;
a drain of the first NMOS transistor is coupled with the first inverter output, a drain of the first PMOS transistor, a gate of the second NMOS transistor, and a gate of the second PMOS transistor;
a drain of the second NMOS transistor is coupled with the second inverter output, a drain of the second PMOS transistor, a gate of the first NMOS transistor, and a gate of the first PMOS transistor;
a source of the first PMOS transistor is coupled with a drain of the third PMOS transistor, and serves as the second end;
a source of the second PMOS transistor is coupled with a drain of the fourth PMOS transistor, and serve as the third end;
a source of the third PMOS transistor serves as the third terminal of the first transistor; and
a source of the fourth PMOS transistor serves as the third terminal of the second transistor.

6. The sense amplifier of claim 5, wherein
the pre-charge and equalizing circuit comprises a third NMOS transistor, a fourth NMOS transistor, and a fifth NMOS transistor; and
a memory cell electrically coupled with the first data line and the second data line.

7. A method comprising:
generating a first control signal by using an AND gate or a NAND gate based on a second control signal and a third control signal;
applying a voltage value to a first data line and a second data line based on the first control signal; and
enabling a sense amplifier based on the second control signal,
wherein the method further comprises, during a time period the sense amplifier is enabled:
causing a first node of the sense amplifier to have a first voltage value towards a voltage value at the first data line and a second node of the sense amplifier to have a second voltage value towards a voltage value at the second data line;
causing a differential voltage between the first data line and the second data line to develop based on the third control signal; and
sensing the developed differential voltage between the first data line and the second data line.

8. The method of claim 7, wherein
the first voltage value towards the voltage value at the first data line is based on a threshold voltage of a first transistor of the sense amplifier; and
the second voltage value towards the voltage value at the second data line is based on a threshold voltage of a second transistor of the sense amplifier.

9. The method of claim 7, further comprising:
electrically coupling a first node of a memory cell to a third data line and a second node of the memory cell to a fourth data line based on the third control signal.

10. The method of claim 9, wherein
electrically coupling a first node of a memory cell to the third data line and a second node of the memory cell to the fourth data line comprises:
- activating a control line of the memory cell that is coupled with the third data line and the fourth data line; and
- electrically coupling the third data line with the first data line and the fourth data line with the second data line.

11. The method of claim 7, wherein
the sense amplifier includes a first PMOS transistor, a second PMOS transistor, a first NMOS transistor, a second NMOS transistor, a third NMOS transistor, and a fourth NMOS transistor;
a source of the first PMOS transistor is coupled with a source of the second PMOS transistor, and serves as a first end of a cross coupled pair of inverters of the sense amplifier;
a drain of the first PMOS transistor is coupled with a drain of the first NMOS transistor, a gate of the second PMOS transistor, and a gate of the second NMOS transistor;
a drain of the second PMOS transistor is coupled with a drain of the second NMOS transistor, a gate of the first PMOS transistor, and a gate of the first NMOS transistor;
a source of the first NMOS transistor is coupled with a drain of the third NMOS transistor, and serves as a second end of the cross coupled pair of inverters, the second end coupled with the first node;
a source of the second NMOS transistor is coupled with a drain of the fourth NMOS transistor, and serve as a third end of the cross coupled pair of inverters, the third end coupled with the second node; and
a source of the third NMOS transistor is coupled with a source of the fourth NMOS transistor, and is configured to receive a voltage.

12. The method of claim 7, wherein
the sense amplifier includes a first NMOS transistor, a second NMOS transistor, a first PMOS transistor, a second PMOS transistor, a third PMOS transistor, and a fourth PMOS transistor;
a source of the first NMOS transistor is coupled with a source of the second NMOS transistor, and serves as a first end of a cross coupled pair of inverters of the sense amplifier;
a drain of the first NMOS transistor is coupled with a drain of the first PMOS transistor, a gate of the second NMOS transistor, and a gate of the second PMOS transistor;
a drain of the second NMOS transistor is coupled with a drain of the second PMOS transistor, a gate of the first NMOS transistor, and a gate of the first PMOS transistor;
a source of the first PMOS transistor is coupled with a drain of the third PMOS transistor, and serves as a second end of the cross coupled pair of inverters, the second end coupled with the first node;
a source of the second PMOS transistor is coupled with a drain of the fourth PMOS transistor, and serve as a third end of the cross coupled pair of inverters, the third end coupled with the second node; and
a source of the third PMOS transistor is coupled with a source of the fourth PMOS transistor, and is configured to receive a voltage.

13. A method comprising:
generating a first control signal by using an AND gate or a NAND gate based on a second control signal and a third control signal;
electrically coupling a first node of a memory cell with a first data line and a second node of the memory cell with a second data line;
electrically coupling the first data line with a third data line and the second data line with a fourth data line based on the third control signal;
applying a voltage value to the third data line and the fourth data line based on the first control signal; and
enabling a sense amplifier based on the second control signal,
wherein the method further comprises, during a time period the sense amplifier is enabled:
- causing a first node of the sense amplifier to have a first voltage value closer a voltage value at the third data line based on a threshold voltage of a first transistor of the sense amplifier;
- causing a second node of the sense amplifier to have a second voltage value closer to a voltage value at the fourth data line based on a threshold voltage of a second transistor of the sense amplifier;
- causing a differential voltage between the third data line and the fourth data line to develop based on the third control signal; and
- sensing the developed differential voltage between the first data line and the second data line.

14. The method of claim 13, wherein
electrically coupling a first node of a memory cell with a first data line and a second node of the memory cell with a second data line comprises activating a control line coupled with the memory cell.

15. The method of claim 13, wherein
electrically coupling the first data line with a third data line is through a third transistor; and
electrically coupling the second data line with a fourth data line is through a fourth transistor.

16. The method of claim 13, wherein
applying a voltage value to the third data line and the fourth data line includes controlling a third transistor, a fourth transistor and a fifth transistor that are coupled with the third data line and the fourth data line.

17. The method of claim 13, wherein
the first transistor, the second transistor, a third transistor and a fourth transistor form a cross coupled pair of inverters of the sense amplifier.

18. The method of claim 13, wherein
the sense amplifier includes a first PMOS transistor, a second PMOS transistor, a first NMOS transistor, a second NMOS transistor, a third NMOS transistor, and a fourth NMOS transistor;
a source of the first PMOS transistor is coupled with a source of the second PMOS transistor, and serves as a first end of a cross coupled pair of inverters of the sense amplifier;
a drain of the first PMOS transistor is coupled with a drain of the first NMOS transistor, a gate of the second PMOS transistor, and a gate of the second NMOS transistor;
a drain of the second PMOS transistor is coupled with a drain of the second NMOS transistor, a gate of the first PMOS transistor, and a gate of the first NMOS transistor;
a source of the first NMOS transistor is coupled with a drain of the third NMOS transistor, and serves as a second end of the cross coupled pair of inverters, the second end coupled with the first node;
a source of the second NMOS transistor is coupled with a drain of the fourth NMOS transistor, and serve as a third end of the cross coupled pair of inverters, the third end coupled with the second node; and a source of the third NMOS transistor is coupled with a source of the fourth NMOS transistor, and is configured to receive a voltage.

19. The method of claim 13, wherein the sense amplifier includes a first NMOS transistor, a second NMOS transistor, a first PMOS transistor, a second PMOS transistor, a third PMOS transistor, and a fourth PMOS transistor;

a source of the first NMOS transistor is coupled with a source of the second NMOS transistor, and serves as a first end of a cross coupled pair of inverters of the sense amplifier;

a drain of the first NMOS transistor is coupled with a drain of the first PMOS transistor, a gate of the second NMOS transistor, and a gate of the second PMOS transistor;

a drain of the second NMOS transistor is coupled with a drain of the second PMOS transistor, a gate of the first NMOS transistor, and a gate of the first PMOS transistor;

a source of the first PMOS transistor is coupled with a drain of the third PMOS transistor and serves as a second end of the cross coupled pair of inverters, the second end coupled with the first node;

a source of the second PMOS transistor is coupled with a drain of the fourth PMOS transistor, and serve as a third end of the cross coupled pair of inverters, the third end coupled with the second node; and a source of the third PMOS transistor is coupled with a source of the fourth PMOS transistor, and is configured to receive a voltage.

* * * * *